United States Patent
Sexton

(10) Patent No.: US 8,562,266 B2
(45) Date of Patent: Oct. 22, 2013

(54) FLUSH MOUNTED FASTENER FOR PLASMA PROCESSING APPARATUS

(75) Inventor: Gregory Sexton, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 356 days.

(21) Appl. No.: 13/025,472

(22) Filed: Feb. 11, 2011

(65) Prior Publication Data
US 2011/0206479 A1 Aug. 25, 2011

Related U.S. Application Data

(60) Provisional application No. 61/306,667, filed on Feb. 22, 2010.

(51) Int. Cl.
F16B 23/00 (2006.01)

(52) U.S. Cl.
USPC .......................................... 411/403; 411/407

(58) Field of Classification Search
USPC ........... 411/40, 373, 919, 395, 383, 402, 403, 411/407, 408
See application file for complete search history.

(56) References Cited

U.S. PATENT DOCUMENTS

| | | | | |
|---|---|---|---|---|
| 3,130,994 A | * | 4/1964 | Balducci | 403/20 |
| 3,159,075 A | * | 12/1964 | Bjork | 411/65 |
| 3,405,595 A | * | 10/1968 | Peterson | 411/405 |
| 4,822,227 A | * | 4/1989 | Duran | 411/373 |
| 4,930,371 A | * | 6/1990 | Schneider | 74/527 |
| 5,017,069 A | | 5/1991 | Stencel | |
| 5,074,730 A | * | 12/1991 | Duran | 411/403 |
| 5,249,556 A | | 10/1993 | Emmitt | |
| 5,484,486 A | | 1/1996 | Blackburn et al. | |
| 5,603,472 A | | 2/1997 | Hutter, III | |
| 5,855,460 A | * | 1/1999 | Brehmer et al. | 411/14 |
| 6,123,804 A | | 9/2000 | Babassi et al. | |
| 6,231,038 B1 | | 5/2001 | Keyser et al. | |
| 6,641,343 B1 | | 11/2003 | Duran | |
| 7,296,534 B2 | | 11/2007 | Fink | |
| 7,554,104 B2 | * | 6/2009 | Shimada et al. | 250/492.1 |
| 7,582,186 B2 | | 9/2009 | Strang et al. | |
| 7,604,701 B2 | | 10/2009 | Fink | |
| 7,666,479 B2 | | 2/2010 | Strang | |
| 2003/0106793 A1 | | 6/2003 | Sirkis et al. | |

(Continued)

FOREIGN PATENT DOCUMENTS

JP 2009-115166 A 5/2009

OTHER PUBLICATIONS

International Search Report and Written Opinion mailed Oct. 17, 2011 for PCT/US2011/000239.

*Primary Examiner* — Gary Estremsky
(74) *Attorney, Agent, or Firm* — Buchanan Ingersoll & Rooney PC

(57) ABSTRACT

A fastener assembly for parts of a plasma chamber. The fastener assembly includes a bolt with a tool engaging socket and a spring-loaded pin which fits in a through hole of the bolt. When installed, the spring-loaded pin substantially fills the space in the socket and thus prevents parasitic plasma from forming in spaces between opposed surfaces of the pin and bolt. When a tool such as a hex key is inserted into the socket, the spring-loaded pin retracts and the tool rotates the bolt to attach an upper part to a lower part by engaging threads of the bolt with a threaded hole in the lower part.

11 Claims, 8 Drawing Sheets

(56) References Cited

U.S. PATENT DOCUMENTS

| | | |
|---|---|---|
| 2004/0189336 A1 | 9/2004 | Fink |
| 2005/0098106 A1 | 5/2005 | Fink et al. |
| 2005/0169728 A1 | 8/2005 | Attanasio |
| 2005/0220568 A1 | 10/2005 | Fink |
| 2008/0087641 A1 | 4/2008 | de la Llera et al. |
| 2009/0083953 A1 | 4/2009 | Kim et al. |
| 2009/0133543 A1 | 5/2009 | Diehl et al. |

\* cited by examiner

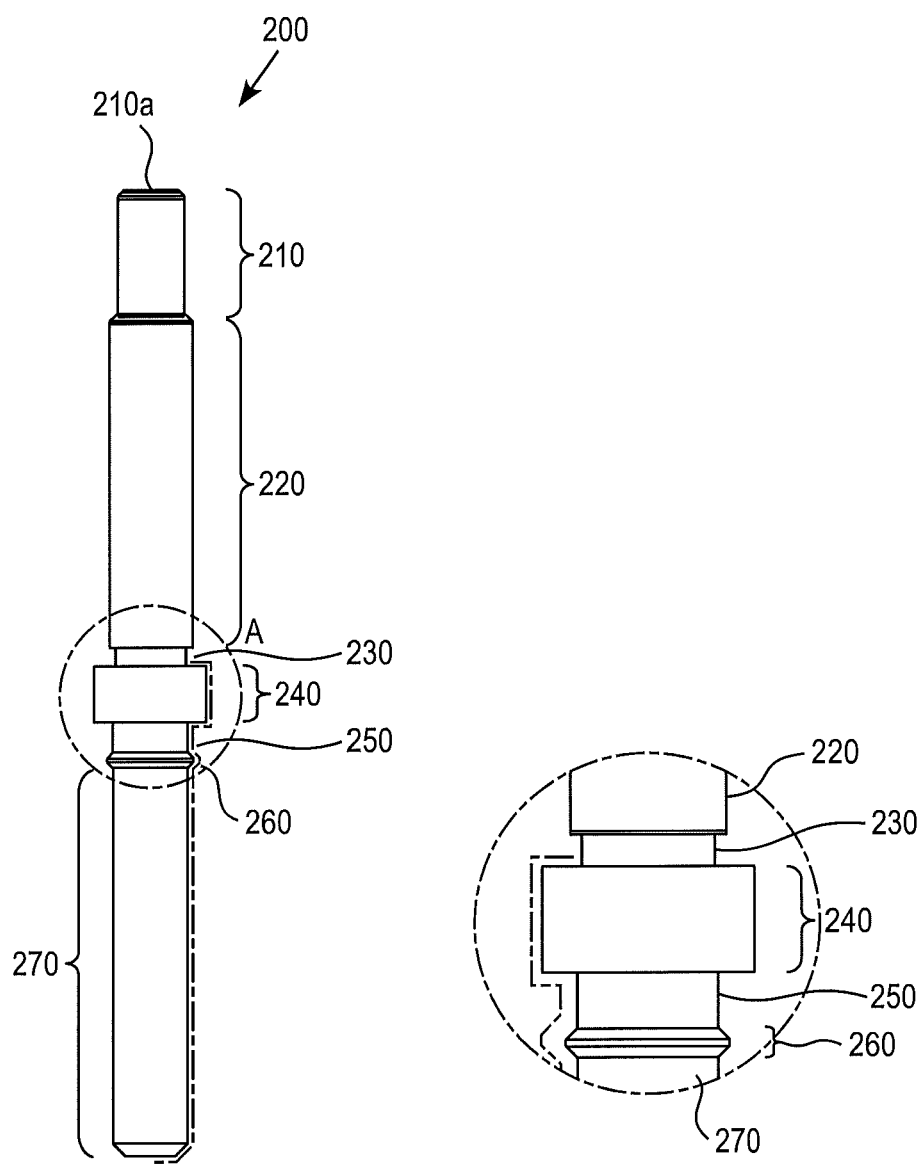

FLUSH MOUNTED FASTENER FOR PLASMA PROCESSING APPARATUS

This application claims priority under 35 U.S.C. §119(e) to U.S. Provisional Application No. 61/306,667 entitled FLUSH MOUNTED FASTENER FOR PLASMA PROCESSING APPARATUS, filed Feb. 22, 2010, the entire content of which is hereby incorporated by reference.

BACKGROUND

With each successive semiconductor technology generation, wafer diameters tend to increase and transistor sizes decrease, resulting in the need for an ever higher degree of accuracy and repeatability in wafer processing. Semiconductor substrate materials, such as silicon wafers, are processed by techniques which include the use of vacuum chambers. These techniques include non plasma applications such as electron beam evaporation, as well as plasma applications, such as sputter deposition, plasma-enhanced chemical vapor deposition (PECVD), resist strip, and plasma etch.

In a typical plasma etch process, plasma density is lower near the edge of the substrate, which may lead to accumulation of a byproduct layer (such as poly-silicon, nitride, metal, etc.) on the top and bottom surfaces of the substrate bevel edge. The byproduct layer may peel or flake off, often onto critical areas of the substrate during transport and succeeding processing steps, thereby leading to lower yield of devices from the substrate. Therefore, it is highly desirable to remove the byproduct from the substrate bevel edge before the substrate goes through the next processing step. One highly effective process is to use plasma to etch away the deposited byproduct on the bevel edge. This process is named plasma bevel etching. An apparatus to carry out this process is a plasma bevel etcher.

Parasitic plasma is undesired during plasma processing of a substrate and can cause contamination due to particles or cause instabilities in the plasma which lead to nonuniform processing. Eliminating parasitic plasma can be difficult as parasitic plasma may form in voids such as hex sockets of hex socket screws, which are widely used in plasma processing systems including plasma bevel etchers. While the hex sockets of the hex socket screws in a plasma processing system could be filled with plugs, such filling renders installation and removal of these screws more difficult and time consuming.

SUMMARY

Described herein is a fastener assembly comprising a bolt with a tool engaging socket such as a hex socket and a spring-loaded pin. When installed, the spring-loaded pin essentially fills the void in the hex socket and thus prevents parasitic plasma from forming therein. When a tool such as a hex key is inserted into the hex socket, the spring-loaded pin is depressed to allow the tool to enter the hex socket and rotate the bolt for removal from a threaded hole.

BRIEF DESCRIPTION OF THE DRAWINGS

FIG. 7 is a side view of the pin wherein the surfaces marked by the dotted line are anodization-free.

FIG. 8 is an enlarged view of the portion A in FIG. 7. The surfaces marked by the dotted line are anodization-free.

DETAILED DESCRIPTION

Figure 1:
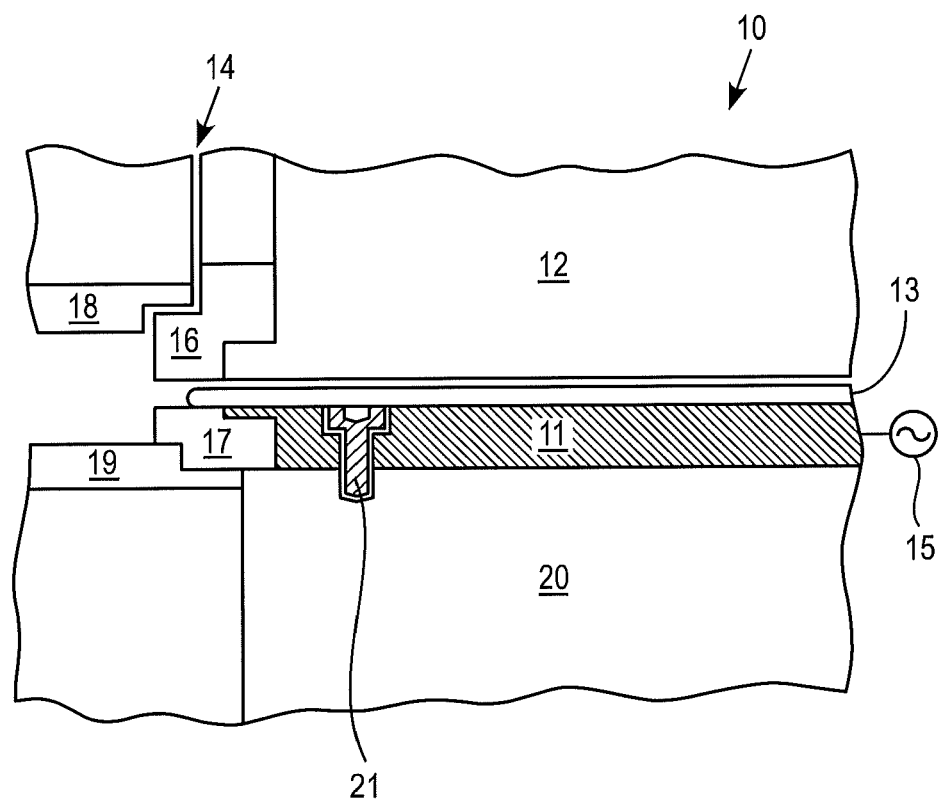
FIG. 1 is a cross sectional schematic of a plasma bevel etcher.
Figure 2:
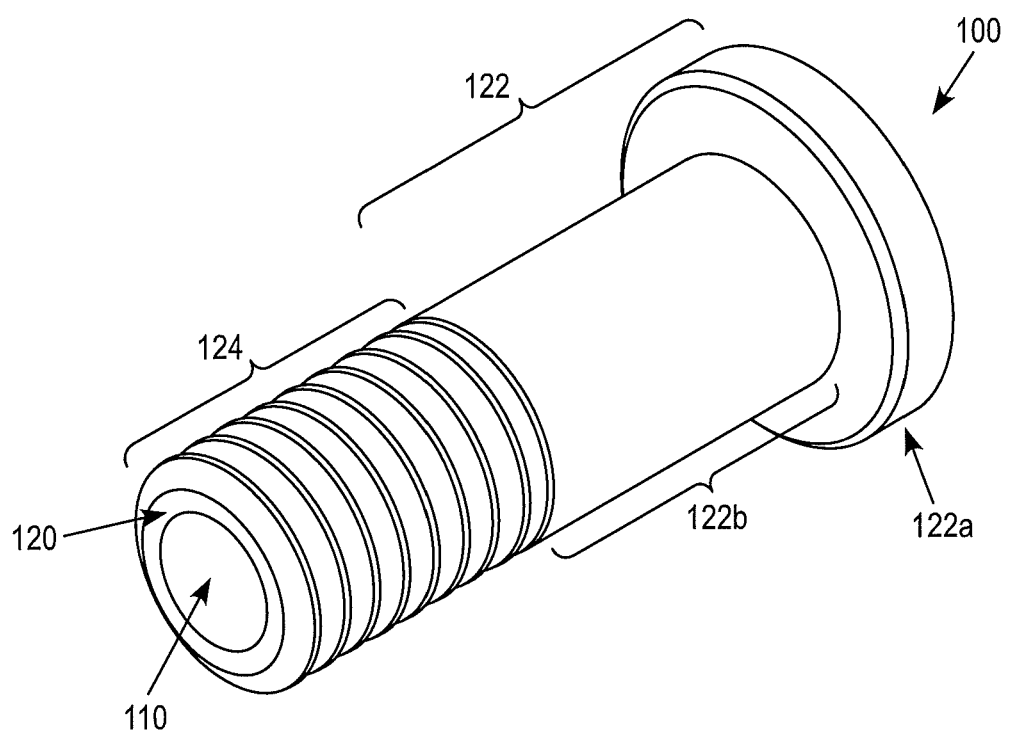
FIG. 2 is a perspective view of the bolt.
Figure 3:
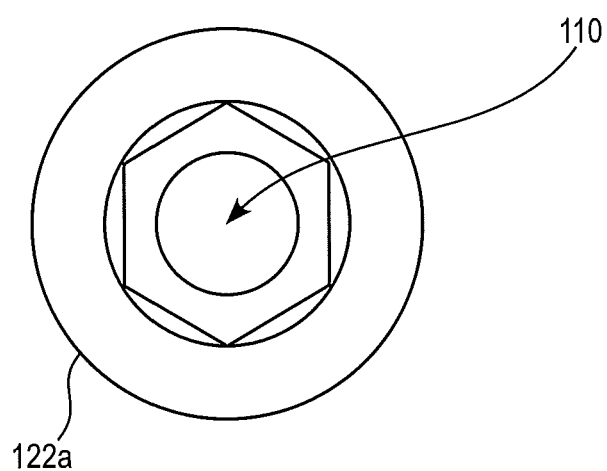
FIG. 3 is a top view of the bolt.
Figure 4:
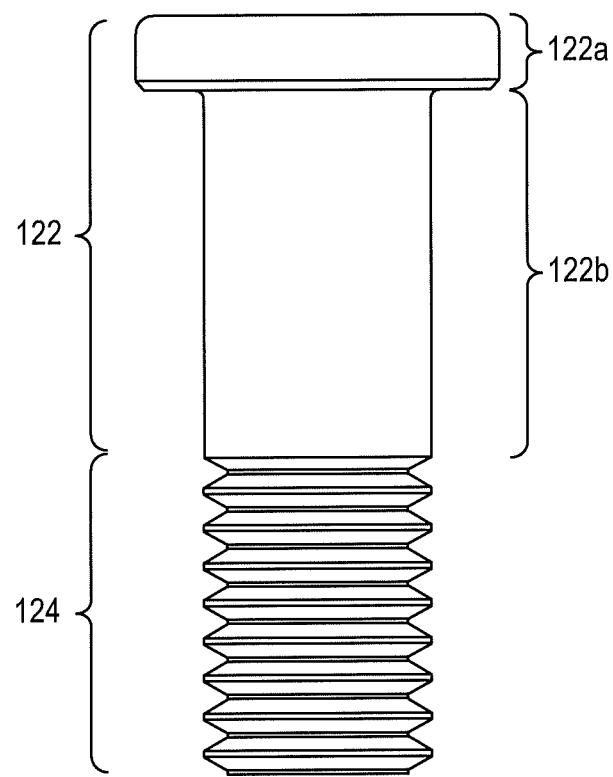
FIG. 4 is a side view of the bolt.
Figure 5:
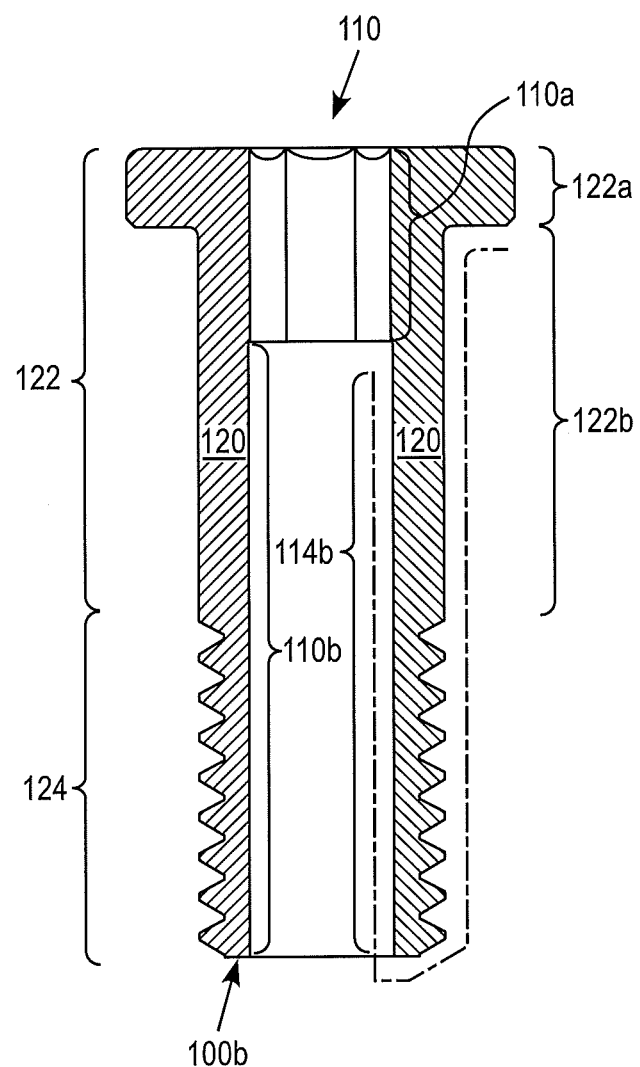
FIG. 5 is a cross-sectional view of the bolt wherein the surfaces marked by the dotted line are anodization-free.

FIG. 1 is a cross sectional schematic of a typical plasma bevel etcher 10. A lower electrode 11 is fastened to an electrode support 20. A radio-frequency (RF) source 15 is electrically connected to the lower electrode 11. A lower plasma exclusion zone (PEZ) ring 17 surrounds the lower electrode 11. An lower extension electrode 19 (lower RF return electrode) surrounds the lower PEZ ring 17. A substrate 13 is supported on the lower electrode 11. An upper PEZ ring 16 surrounds an upper dielectric plate 12. An upper extension electrode 18 (upper RF return electrode) surrounds the upper PEZ ring 16. A gap 14 between the upper extension electrode 18 and the upper PEZ ring 16 is in fluidic communication to a gas source (not shown) and is configured to deliver process gas to the proximity of the bevel edge of the substrate 13. In a bevel etching process, the upper dielectric plate 12, upper PEZ ring 16 and upper extension electrode 18 are lowered until the upper dielectric plate 12 is close enough to the substrate 13 to prevent plasma from forming therebetween. A process gas is fed through the gap 14 to the proximity of the bevel edge of the substrate 13. RF power on the lower electrode 11 is coupled to the extension electrodes 18 and 19 and a plasma is generated therebetween to etch the bevel edge of the substrate 13. Since only the bevel edge of the substrate 13 needs to be etched, plasma is undesirable in the center region above the substrate 13. However, the lower electrode 11 is typically fastened to the electrode support 20 by hex socket screws 21. Parasitic plasma can form in the void in the hex sockets of these screws 21 and affect the substrate 13 adversely.

Described herein is a fastener assembly comprising a bolt 100 with a tool engaging socket and a spring-loaded pin 200. The socket of the fastener assembly is essentially filled by the spring-loaded pin 200 during plasma processing. This fastener assembly can be used to fasten the lower electrode 11 to the electrode support 20, or to fasten other suitable components in the plasma reaction chamber 10 such as a cover ring for the lower electrode 11.

FIGS. 2-5 show an embodiment of the bolt 100. The bolt 100 comprises a center through hole 110 and a side wall 120. The side wall 120 comprises a top section 122 and a bottom section 124. The top section 122 includes a top flange 122a extending radially outward from a cylindrical body 122b. The top section 122 can include an unthreaded outer surface. The bottom section 124 includes a threaded outer surface. The hole 110 comprises a top section 110a and a bottom section 110b. The top section 110a is a non-cylindrical void used as a socket for accommodating a mating tool (a screw driver such as a hex key, a Torx driver, etc.). The bottom section 110b can be a cylindrical void.

In an exemplary embodiment, wherein a plurality of bolts 100 are used to fasten the lower electrode 11 to the electrode support 20, the top flange 122a can have an outer diameter of about 0.38 inch ("about" as used herein means±10%) and a length of about 0.08 inch, and the cylindrical body 122b can have an outer diameter of about 0.24 inch and a length of about 0.35 inch. Edges on the top flange 122a may be rounded to a radius of about 0.02 inch. The bottom section 124 can have a length of about 0.37 inch, and the outer surface of the bottom section 124 can be threaded to a metric ISO screw thread of M6×1. The top section 110a of the hole 110 can be a hexagonal prismatic void, with a length of about 0.19 inch. The base of the hexagonal prismatic void can be a regular hexagon with a diameter (transverse width from one corner to an opposite corner) of about 0.14 inch. The top section 110a is used as a socket for accommodating a mating hex key. The bottom section 110b can be a cylindrical void, with a length of about 0.6 inch and a diameter of about 0.14 inch. The hole 110 is concentric with the side wall 120.

In a preferred embodiment, the bolt 100 can be made of aluminum. An inner surface 114b extending about 0.57 inch upwardly from the bottom of the hole 110, a bottom face 100b of the bolt 100, the outer surface of the bottom section 124 of the side wall 120, an outer surface of the cylindrical body 122b and a bottom surface of the top flange 122a are non-anodized (bare aluminum). All other surfaces of the bolt 100 can be anodized to a thickness of about 0.002 inch.

Figure 6:
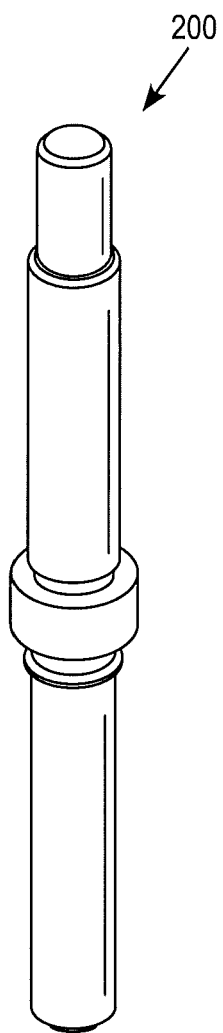
FIG. 6 is a perspective view of the pin.

FIGS. 6-8 show an embodiment of the pin 200. When the pin is assembled in the bolt 100 and the bolt is used to attach one part to another part, the pin 200 essentially fills the top section 110a. The pin 200 can be spring-loaded such that the pin 200 retracts (depressed) when a tool is inserted into the top section 110a.

In a preferred embodiment, the pin 200 comprises seven concentric cylindrical sections, 210, 220, 230, 240, 250, 260 and 270; 210 being the top-most section and 270 being the bottom-most section. The first section 210 can have a length of about 0.21 inch, a diameter of about 0.11 inch with a 45° chamfer of about 0.01 inch wide at the top edge thereof. The second section 220 can have a length of about 0.56 inch, a diameter of about 0.14 inch with a 45° chamfer of about 0.01 inch wide at the top edge thereof. The third section 230 can have a length of about 0.03 inch and a diameter of about 0.12 inch. The fourth section 240 can have a length of about 0.1 inch and a diameter of about 0.19 inch and forms a rim engaging the bottom face 100b of the bolt 100. The fifth section 250 can have a length of about 0.05 inch and a diameter of about 0.13 inch. The sixth section 260 is a retention ring for holding an upper turn of a spring surrounding section 270 and can have a length of about 0.025 inch and a diameter of about 0.15 inch. Both the top edge and bottom edge of the section 260 can have a 45° chamfer of about 0.014 inch wide. The seventh section 270 can have a length of about 0.68 inch, a diameter of about 0.13 inch with a 45° chamfer of about 0.02 inch wide at a bottom edge thereof. The surfaces of the sections 240, 250, 260 and 270 can be bare aluminum (free of anodization). All other surfaces of the pin 200 such as surfaces of the first and second sections 210 and 220 can be anodized to a thickness of about 0.002 inch.

Figure 9:
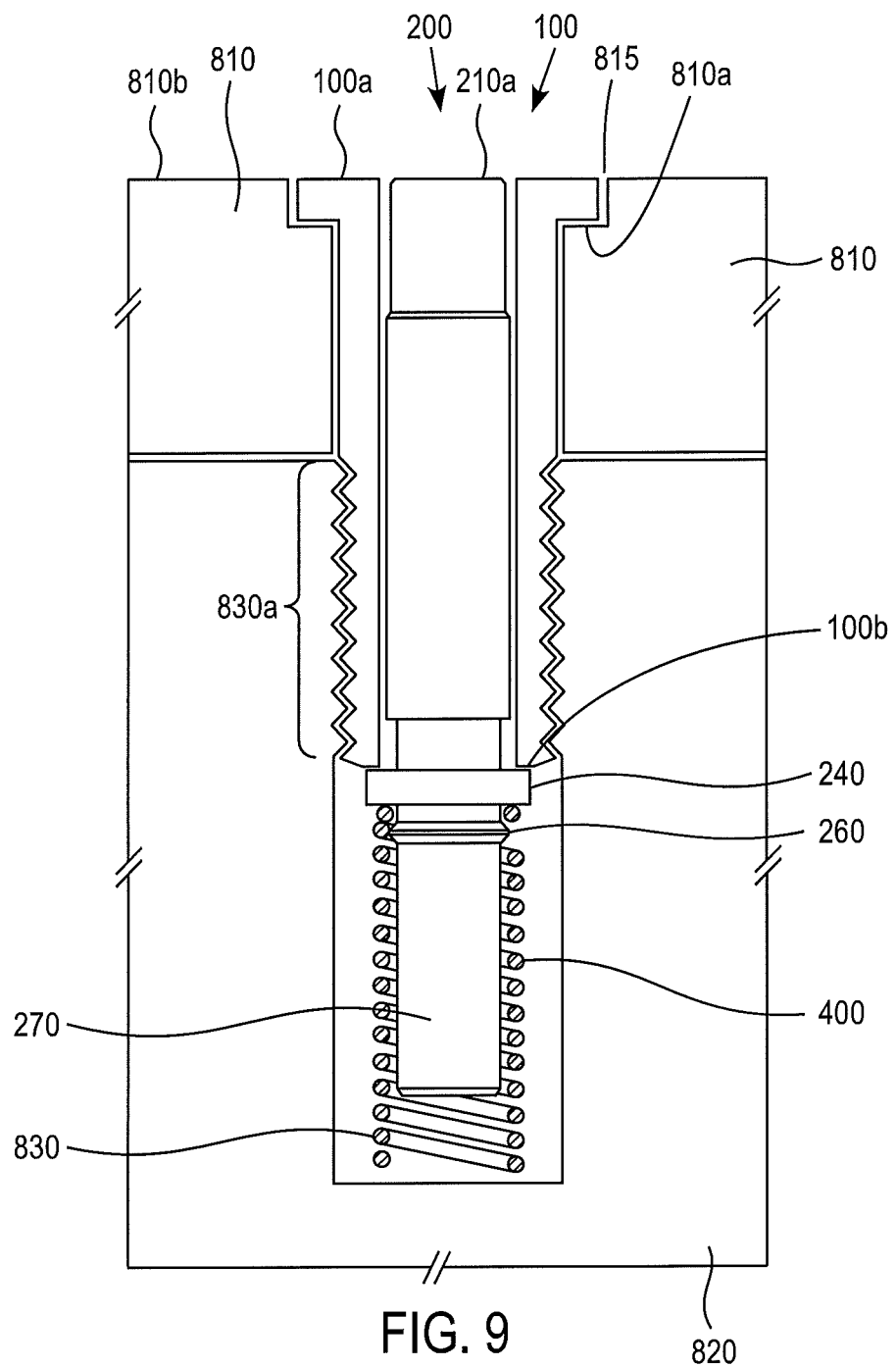
FIG. 9 is a cross-sectional view of the assembly of the bolt and the pin, in use of fastening an object to a base.

FIG. 9 shows a preferred embodiment of the fastener assembly configured to fasten a first member 810 (such as the lower electrode 11 or a cover ring) to a second member 820 (such as the electrode support 20). The first member 810 has a stepped through hole 815 to accommodate the flange 122a and at least part of the top section 122 of the bolt 100. The height of the step is essentially equal to the thickness of the top flange 122a. An outer diameter of the upper portion of the hole 815 is slightly larger (e.g., about 0.001 to 0.002 inch larger) than the diameter of the top flange 122a. The base 820 has a blind hole 830. The blind hole 830 has a threaded upper section 830a for engaging the threaded outer surface of the bottom section 124. The sum of the length of the blind hole 830 and the length of the through hole 815 is larger than the total length of the pin 200 to allow room for the pin 200 to be retracted in the hole 830. Preferably the sum of the length of the blind hole 830 and the length of the through hole 815 is greater than 1.8 inches. If horizontal surface 810a of the step in the hole 815 is electrically conductive, the bolt 100 can be electrically connected to the first member 810 at least through contact between the bottom surface of the top flange 122a and the opposed surface of member 810; the pin 200 is electrically connected to the bolt 100 at least through the annular bottom face 100b of the bolt 100 which contacts the opposed surface of section 240 of the pin. When the bolt is threaded in hole 830, the pin 200 substantially fills the hole 110.

Installation of the fastener assembly includes two steps: (a) a spring 400 (preferably with a free length of about 1.25 inches, an outside diameter of about 0.18 inch, an inside diameter (rod diameter) of at least about 0.13 inch and slightly smaller than the diameter of the section 260, and a spring constant of about 5.8 lbs/inch) is placed on sections 250, 260 and 270 such that the sections 250, 260 and 270 of the pin 200 are fitted coaxially into the center opening of the spring 400, and that the section 240 of the pin 200 acts as a stop against a top end of the spring 400, and an upper turn of the spring 400 is resiliently fitted over the section 260 so that the spring 400 will remain on the pin 200 when the pin is removed from the hole 830. (b) The pin 200 is depressed by a tool such as a hex key and the bolt 100 is rotated with the tool so as to depress the pin 200 and engage threads of the bottom section 124 with the threads of the blind hole 830. When the bolt 100 is fully threaded into the hole 815, a top face 100a of the bolt 100 is flush with a top surface 810b of the first member 810 and after removal of the hex key the face 210a of the pin is flush with the top face 100a. To remove the bolt, the tool is inserted into the hole section 110a such that the pin 200 is pushed downward and the spring 400 is compressed. When the tool is removed from the socket 110a, the spring 400 pushes the pin 200 upward such that a rim formed by the top surface of the section 240 of the pin 200 remains in contact with the bottom face 100b of the bolt 100, and thus a top surface 210a of the pin 200 remains flush with the top surface 100a of the bolt 100.

Although the top section 110a can have a hexagonal or other non-circular cross-section and the pin can have a cylindrical cross-section, the tolerances between opposed surfaces of the top section 110a and the pin 200 are such that the top section (socket) 110a of the hole 110 in the bolt 100 is substantially filled by the section 210 of the pin 200. Therefore, during plasma processing of substrates, parasitic plasma is prevented from forming inside the top section 110a of the hole 110.

While a fastener assembly, and its components including a bolt and a pin, have been described in detail with reference to specific embodiments thereof, it will be apparent to those skilled in the art that various changes and modifications can be made, and equivalents employed, without departing from the scope of the appended claims.

I claim:

1. A fastener assembly for use in a plasma processing chamber which avoids parasitic plasma formation when used to attach parts inside the plasma chamber, the fastener assembly comprising:

a bolt having a tubular body with an axially extending center through hole, a threaded outer surface, and a non-cylindrical tool engaging socket at the top of the through hole, the socket configured to engage a tool used to rotate the bolt during insertion of the bolt in a threaded hole;

a pin having a shaft extending a length greater than a length of the through hole, the pin being movable from a lower position at which an upper portion of the through hole is not filled to an upper position at which a top face of the pin is flush with a top face of the bolt; and a spring biasing the pin in the upper position, such that the pin is retractable from the upper position to the lower position when a tool is inserted in the tool engaging socket at the top of the through hole;

wherein the pin includes a rim between the spring and an axial end of the bolt, the rim engaging the axial end of the bolt when the pin is in the upper position.

2. The fastener assembly of claim 1, wherein the bolt includes a flange and the top face of the bolt extends inwardly from an outer periphery of the flange.

3. A fastener assembly for use in a plasma processing chamber which avoids parasitic plasma formation when used to attach parts inside the plasma chamber, the fastener assembly comprising:

a bolt having a tubular body with an axially extending center through hole, a threaded outer surface, and a tool engaging socket at the top of the through hole, the socket configured to engage a tool used to rotate the bolt during insertion of the bolt in a threaded hole;

a pin having a shaft extending a length greater than a length of the through hole, the pin being movable from a lower position at which an upper portion of the through hole is not filled to an upper position at which a top face of the pin is flush with a top face of the bolt; and a spring biasing the pin in the upper position;

wherein the spring is a helical spring surrounding a lower section of the pin, the spring having a length greater than a length of the lower section of the pin and the pin includes a retention ring engaging at least one turn of the spring and a stop engaging an upper end of the spring when the spring is compressed.

4. The fastener assembly of claim 1, wherein the pin and bolt are made of aluminum and the top faces of the bolt and pin are anodized surfaces.

5. A fastener assembly for use in a plasma processing chamber which avoids parasitic plasma formation when used to attach parts inside the plasma chamber, the fastener assembly comprising:

a bolt having a tubular body with an axially extending center through hole, a threaded outer surface, and a tool engaging socket at the top of the through hole, the socket configured to engage a tool used to rotate the bolt during insertion of the bolt in a threaded hole, wherein the bolt includes a top flange with an outer diameter of 0.38 inch and length of 0.08 inch, an unthreaded section extending from the flange having a diameter of 0.24 inch and length of 0.35 inch, and a threaded section extending from the unthreaded section having ISO screw threads of M6×1 and length of 0.37 inch, and the tool engaging socket comprises a hex socket extending from the top face having a length of 0.19 inch;

a pin having a shaft extending a length greater than a length of the through hole, the pin being movable from a lower position at which an upper portion of the through hole is not filled to an upper position at which a top face of the pin is flush with a top face of the bolt; and a spring biasing the pin in the upper position.

6. A fastener assembly for use in a plasma processing chamber which avoids parasitic plasma formation when used to attach parts inside the plasma chamber, the fastener assembly comprising:

a bolt having a tubular body with an axially extending center through hole, a threaded outer surface, and a tool engaging socket at the top of the through hole, the socket configured to engage a tool used to rotate the bolt during insertion of the bolt in a threaded hole;

a pin having a shaft extending a length greater than a length of the through hole, the pin being movable from a lower position at which an upper portion of the through hole is not filled to an upper position at which a top face of the pin is flush with a top face of the bolt; and a spring biasing the pin in the upper position;

wherein the pin includes seven sections including a first section extending from the top face having a diameter of 0.11 inch and length of 0.21 inch, a second section extending from the first section having a diameter of 0.14 inch and length of 0.56 inch, a third section extending from the second section having a diameter of 0.12 inch and length of 0.03 inch, a fourth section extending from the third section having a diameter of 0.19 inch and length of 0.1 inch, a fifth section extending from the fourth section having a diameter of 0.13 inch and length of 0.05 inch, a sixth section extending from the fifth section having a diameter of 0.15 inch and length of 0.025 inch, and a seventh section extending from the sixth section having a diameter of 0.13 inch and length of 0.68 inch.

7. A bolted assembly of a plasma chamber attached together with a fastener assembly which avoids parasitic plasma formation when used to attach parts inside the plasma chamber, comprising:

an upper part having a stepped hole;

a lower part having a blind hole with an upper threaded section and a lower unthreaded section; and a fastener assembly, comprising:

a bolt having a tubular body with an axially extending center through hole, a threaded outer surface, and a tool engaging socket at the top of the through hole, the socket configured to engage a tool used to rotate the bolt during insertion of the bolt in a threaded hole;

a pin having a shaft extending a length greater than a length of the through hole, the pin being movable from a lower position at which an upper portion of the through hole is not filled to an upper position at which a top face of the pin is flush with a top face of the bolt; and a spring biasing the pin in the upper position; wherein the bolt has a flange received in an upper section of the stepped hole, an unthreaded section received in a lower section of the stepped hole, a threaded section engaged with a threaded upper section of the blind hole; and the spring surrounds a lower section of the pin and is received in the lower section of the blind hole, the spring being compressed against a stop on the pin and pressing a rim of the pin against an axial end of the bolt when the pin is in the upper position.

8. The bolted assembly of claim 7, wherein the socket is a hex socket and the upper and lower parts are aluminum plates of a lower electrode assembly on which a substrate is supported during plasma processing thereof.

9. The bolted assembly of claim 7, wherein the upper part comprises a cover ring having a plurality of stepped holes therein, an upper section of each stepped hole receiving a flange of the bolt such that the top face of the bolt and the top face of the pin are flush with an upper surface of the cover ring.

10. A method of attaching the bolted assembly of claim 7, comprising:

placing the spring on a lower end of the pin;

inserting an upper end of the pin in the through hole of the bolt;

inserting the bolt with the pin fitted therein into the stepped hole of the upper part and with the spring on the lower end of the pin in the blind hole of the lower part;

depressing the pin with a tool which matingly engages the socket in the bolt and rotating the bolt with the tool until the top face of the bolt is flush with an upper surface of the upper part;

removing the tool and allowing the spring to push the pin to the upper position with the top face of the pin flush with the top face of the bolt.

11. A method of detaching the bolted assembly of claim 7, comprising:

depressing the pin with a tool which matingly engages the socket in the bolt and rotating the bolt with the tool until the threads of the bolt disengage with the threads of the blind hole.

\* \* \* \* \*